United States Patent
Luschi et al.

(10) Patent No.: US 6,271,772 B1
(45) Date of Patent: Aug. 7, 2001

(54) METHOD AND APPARATUS FOR ITERATIVE DECODING FROM A CENTRAL POOL

(75) Inventors: Carlo Luschi, Oxford (GB); Syed Aon Mujtaba, Berkeley Heights, NJ (US); Magnus Sandell; Paul Edward Strauch, both of Swindon (GB); Ran-Hong Yan, Longcot (GB); Stephan ten Brink, Allmersbach im Tal (DE)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/235,049

(22) Filed: Jan. 21, 1999

(30) Foreign Application Priority Data

Jan. 27, 1998 (EP) ................................. 98300556

(51) Int. Cl.⁷ ..................................................... H03M 7/34
(52) U.S. Cl. .............................................. 341/51; 370/342
(58) Field of Search ............................ 341/51; 370/324, 370/325, 433, 450, 331, 342; 714/755, 790, 792; 455/447, 452

(56) References Cited

U.S. PATENT DOCUMENTS

| | | |
|---|---|---|
| 5,249,290 | 9/1993 | Heizer . |
| 5,467,131 | 11/1995 | Bhaskaran . |
| 5,852,604 * | 12/1998 | Cooley et al. .................. 370/324 |
| 5,982,780 * | 11/1999 | Bohm et al. .................... 370/450 |
| 6,029,264 * | 2/2000 | Kobayashi et al. ............ 714/755 |
| 6,038,696 * | 3/2000 | Chouly et al. ................. 714/786 |

FOREIGN PATENT DOCUMENTS

| | | |
|---|---|---|
| 60-140979A | 7/1985 | (JP) . |
| 7-015728A | 7/1995 | (JP) . |
| 7-236143 | 7/1995 | (JP) . |
| 8-018518A | 8/1996 | (JP) . |
| 8-205143 | 8/1996 | (JP) . |
| 9-252254A | 9/1997 | (JP) . |

OTHER PUBLICATIONS

Bauch, et al "Iterative Equalization and Decoding in Mobile Communications Systems" EPCMCC '97, The Second European Personal Mobile Communications Conference Together With 3. ITG–Fachtagung "Mobile Kommunikation" Sep. 30–Oct. 2, 1997 Berlin pp. 307–312.

European Search Report dated Apr. 14, 1998.

* cited by examiner

Primary Examiner—Patrick Wamsley

(57) ABSTRACT

Apparatus and method for iteratively decoding a signal are provided. The apparatus includes a central pool of resources for iteratively decoding signals. The central pool may run a plurality of iterative decoding processes, each process being allocated to a signal processing unit upon request and depending upon resource availability.

16 Claims, 4 Drawing Sheets

METHOD AND APPARATUS FOR ITERATIVE DECODING FROM A CENTRAL POOL

CROSS-REFERENCE TO RELATED APPLICATION

This application claims priority of European Patent Application No. 98300556.2, which was filed on Jan. 27, 1998.

BACKGROUND OF THE INVENTION

1. Field of the Invention

This invention relates to iterative decoding of signals in a Multiuser Detection and Demodulation System (MDDS), e.g. a base station in a digital wireless communication system.

2. Description of the Related Art

Recent improvements in communication theory (using the "Turbo Principle") have shown that in certain digital communication systems, involving a plurality of users in wireless communication with a receiver, an improvement in the quality of the decoded signal can be achieved by applying iterative decoding steps to the received data. In particular, "Iterative Equalization and Decoding in Mobile Communication Systems" by Bauch, Khorram and Hagenauer, EPMCC '97, pp 307–312, October 1997, Bonn, Germany, discusses the application of the Turbo principle to iterative decoding of coded data transmitted over a mobile radio channel. In order to be suitable for iterative decoding, a transmitted signal must be encoded by at least two concatenated codes, either serially or parallely concatenated.

The signal is then decoded in a first decoding step, a first decoder being used to decode the inner code and a second decoder is used to decode the outer code, to provide soft output values on the reliability of the hard decision values. In a first iteration the decoding step is repeated and the soft output values are used as input values for the first and second decoder.

In the particular application of a mobile communication system, the channel encoder and the intersymbol interference (ISI)-channel may be viewed as a serially concatenated encoding scheme, with the channel encoder acting as the outer encoder and the ISI-channel acting as an inner, rate 1, block encoder. Thus, iterative decoding is suitable for application, in particular, to the European Wireless Digital Cellular Standard "GSM" with the equalizer performing the inner decoding step and the decoder providing the outer decoding step. Where bad communication channel conditions (low SNR, fading, multipath propagation, etc) exist, an improvement in the Bit Error Rate (BER) may be achieved with each iterative decoding step until a BER floor is reached. The signal received by a base station is equalized to provide soft decision values of the received coded bits.

Repeating the decoding step several times can improve the BER of the received signal. However, each iterative decoding step consumes resources, such as memory, computation time and ties up dedicated ASICs (Application Specific Integrated Circuits). In a practical base station, the number of signals that can be decoded in parallel is limited by the number of signal processing units (SPU) available; providing iterative decoding hardware, such as digital signal processors (DSPs), and software to each SPU adds considerably to the cost and complexity of the base station.

SUMMARY OF THE INVENTION

According to a first aspect of the invention there is provided apparatus for iteratively decoding a signal comprising:

a signal processing unit; and iterative decoding resources for running at least one iterative decoding process on said signal characterized in that the iterative decoding resources are located in a central pool and are allocated to said signal process unit when an iterative decoding process is required.

Each user in a MDDS may have a different Quality of Service (QoS) requirement, i.e. different BER and latency constraints due to differing communication services. For example: voice communication has the lowest BER requirement (i.e. can tolerate many bit errors) with the highest latency constraints (i.e. cannot tolerate long delays in two way conversation); visual communication has a higher BER requirement and high latency constraints; data communication (e.g. wireless Internet web-browsing) has the highest BER requirements and the lowest latency constraints. Each user communicates with the base station with a different signal quality (i.e. SNR), multipath propagation and fading due to differing distance from the base station, propagation environment and, if mobile, speed.

An advantage of the invention is that for each user a differing number of iterative decoding steps may be performed to achieve a target QoS requirement.

BRIEF DESCRIPTION OF THE DRAWINGS

An embodiment of the invention is described below, using by way of example a mobile cellular communication system, and with reference to the following figures, in which.

DETAILED DESCRIPTION

Figure 1:
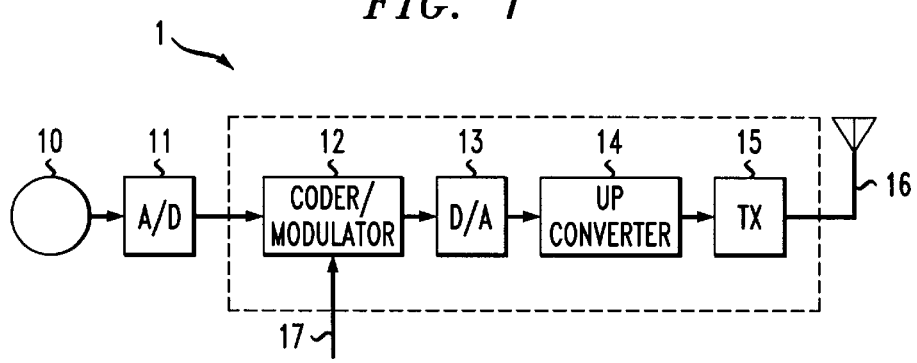
FIG. 1 shows, in outline, a mobile station suitable for use with an MDDS according to the invention.

An end-user device such as a mobile station may use any one of a number of communication protocols to communicate with its nearest base station, using a plurality communication channels across an air interface. FIG. 1 illustrates in outline a mobile station in which voice communication is received by a microphone 10 and converted to a digital data stream by the analogue to digital (A/D) convertor 11. The data stream is then coded and modulated, as appropriate, by the coder/modulator 12, according to the communication protocol required by the mobile cellular communication system. The coded data stream is then converted to an analogue signal by the digital to analogue convertor(D/A) 13 and upconverted to an appropriate radio frequency by the upconvertor 14. The data signal is power amplified in the transmitter 15 and transmitted by antenna 16 on a communication channel over an air interface to a local base station. If the mobile station is required to transmit a signal other than voice (e.g. e-mail, fax, etc) the data is fed directly into the coder/modulator 12, via data line 17, in a digital format.

Figure 2:
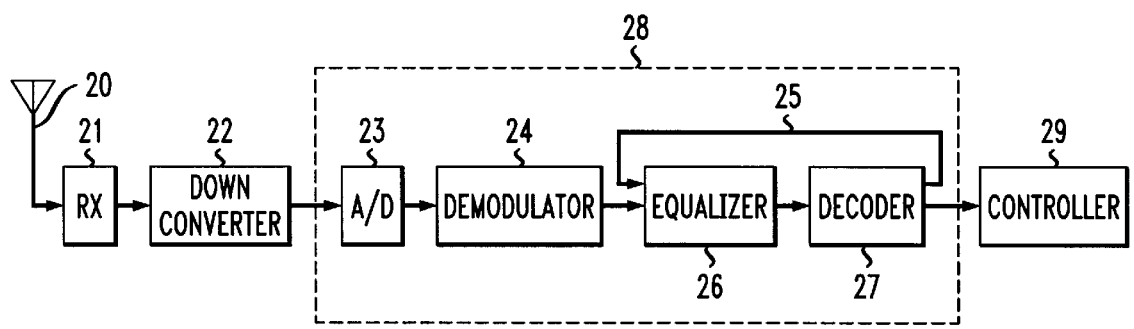
FIG. 2 shows, in outline, a base station according to the prior art.

The transmitted signal may be received, demodulated and decoded by a base station, as shown in FIG. 2. The receiving antenna 20 and receiver 21 provide an analogue signal which is power amplified and demodulated down, by down convertor 22, to a frequency suitable for further processing. The signal is then digitized by A/D convertor 23, demodulated (24) and iteratively decoded along the iterative path 25, by an equalizer (26) and a decoder (27) to provide an improved signal. The A/D converter 23, demodulator 24 equalizer 36 and decoder together form a signal processing unit (SPU) 28, for digital base band processing of the received signal. In the GSM the data is transmitted in bursts of 150 bits and each burst is iteratively decoded. If some other communications protocol is employed the data is processed into blocks or packets for the iterative decoding. The improved signal is then passed to a base station controller 29 which determines whether the signal is suitable for connection to, for instance, the public switched telephone network or another mobile switching centre. The base station controller is connected to the transmitter equipment (not shown) in the base station which transmits information and other control signals back to the mobile station.

Figure 3:
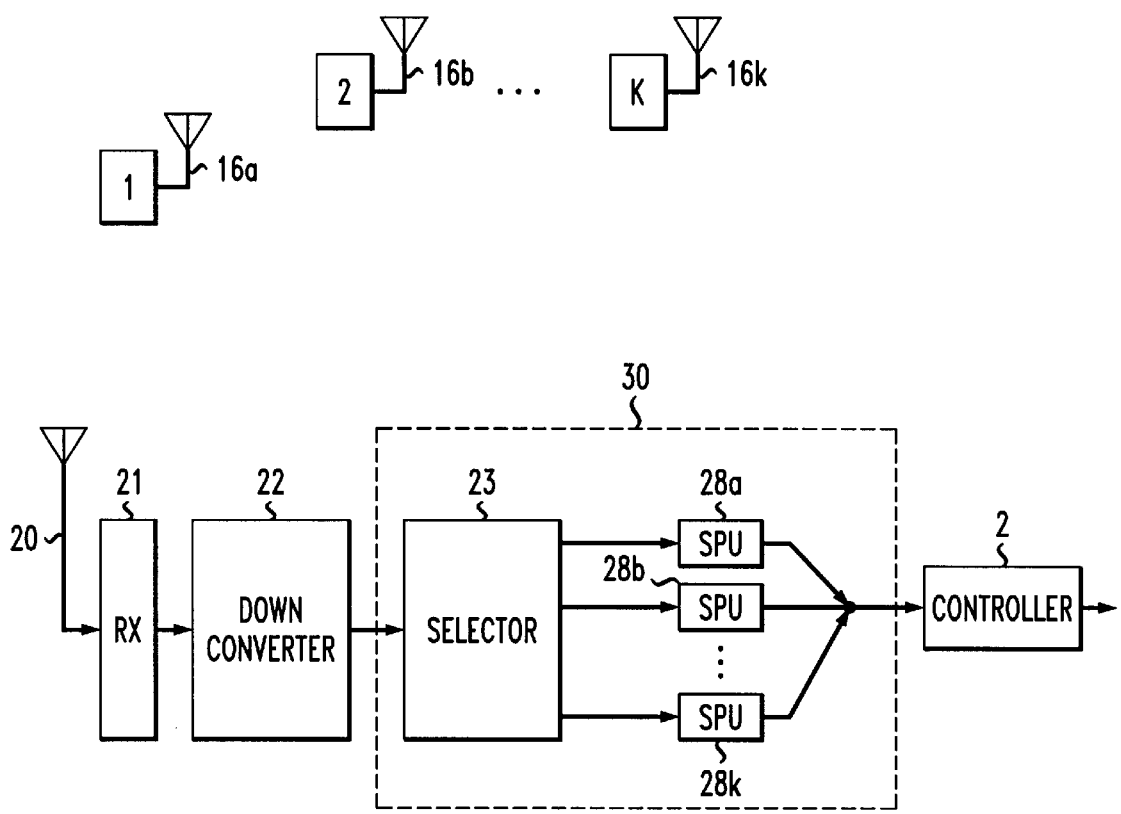
FIG. 3 shows, an outline, a multiuser mobile wireless communication system according to the prior art.

FIG. 3 shows a multiuser system according to the prior art comprising a plurality of mobile stations (1,2, . . . k) each having a different QoS requirement and different channel conditions. The system also includes a base station, including a number of signal processing units (SPU) 28a, 28b, . . . 28k and an SPU selector 32, combined into a multiuser signal processing unit 30. The number of mobile stations which may connect to and communicate through a base station is limited by the number of SPUs available. Each SPU requires complex digital signal processors in the iterative decoding path 25 and each DSP is replicated in each SPU, leading to a very expensive base station.

Figure 4:
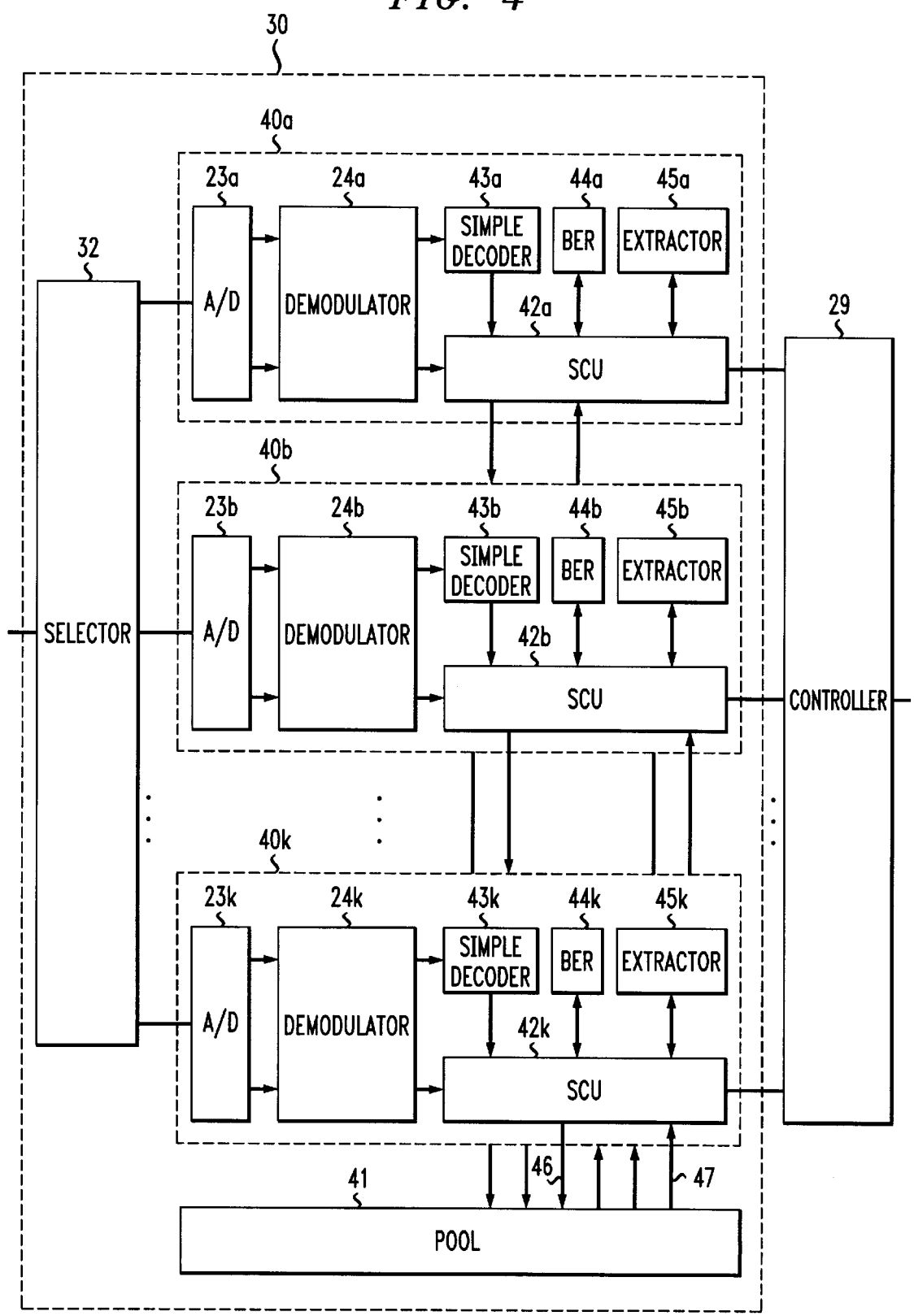
FIG. 4 shows, in detail, a multiuser signal processing device according to the invention.

FIG. 4 illustrates a multiuser signal processing device 30 according to the invention, comprising a selector 32, a plurality of iterative signal processing units (ISPU) 40a, 40b, . . . 40k, and a pool 41 of hardware and software resources available for iterative decoding of signals received by the base station. The pool includes a number of DSPs, memory and algorithms for the iterative decoding contained in specialist software. Each ISPU requests resources in the pool via a scheduling control unit (SCU) 42a, 42b, . . . 42k. After a signal is received, amplified and down-converted by antenna 20, receiver 21 and down convertor 22 (not shown in FIG. 4) it is allocated to an ISPU by selector 32. The ISPU digitizes the signal with an A/D convertor (23a, 23b, . . . 25k) and demodulates the signal with a demodulator (24a, 24b, . . . 24k). A simple decoder (43a, 43b, . . . 43k) provides the SCU with basic bit estimation. The bit error rate (BER) is estimated by estimator (44a, 44b, . . . 44k) and the extractor (45a, 45b, . . . 45k) extracts information from the signal regarding QoS requirements and the call priority. This information is feed back into the SCU so that appropriate resources in the pool may be requested. The BER estimation and information extraction is performed continually, enabling the SCU to dynamically alter resources requested dependent upon the varying signal processing requirements. Once the BER and QoS have reached acceptable levels, the signal is passed out of the ISPU to the base station controller 29, as described above.

The resources allocated to a particular ISPU may be dynamically updated, either continually or stepwise (e.g. every five seconds) during a call. The number of iterations required to achieve the target signal quality may vary during the call dependent upon, for example, the signal propagation environment. Likewise the mobile station QoS requirements may vary during a call since the communication traffic may be lumpy. For example, a mobile station engaged in data exchange for updating e.mail may have one QoS requirement when downloading data and a different QoS requirement when uploading data.

In FIG. 4, each SCU begins the iterative decoding process with local knowledge, namely QoS constraints and resources currently available in the pool. The resources are thus allocated on a first come first served basis; the pool must remove resources from a particular SCU if necessary and requires a central resource allocation controller. This central SCU controller may be used to recognize high priority calls, e.g. to or from the emergency services, and to arrange resources appropriately.

Alternatively, SCUs may be interconnected and thus each SCU would begin iterative decoding with global knowledge. Thus SCUs would be able to exchange and negotiate resources in the pool in order to optimize the utilization of the available resources. This alternative is significantly advantageous in systems where the pool is usually fully loaded and many calls have the same priority. Although the central SCU controller is not necessary the implementation of each SCU becomes more complex without it.

A typical call may be initiated either by the mobile station or by the base station. In either scenario, the call set up is performed on different channels to the main traffic channel, over which data is exchanged between the base station and the mobile station. The kth mobile station to establish a call is allocated by selector 32 to the kth ISPU in the multiuser signal processing device 30. During the call set up the SCU (42k) uses the simple decoder, bit error rate estimator (44k) and information extractor (45k) to determine the initial QoS requirements for the call and the call priority. According to these parameters, the SCU requests, over the data connection 46, DSP and memory resources within the pool. Each "block" of incoming data is passed to the pool over the data line 46. The iterative decoding process is run in the pool for several iterations until either the requested bit error rate is achieved, or maximum latency is about to be exceeded. The improved signal is then returned over data line 47 to the SCU, which passes the data out to the base station controller 29. If latency constraints are very tight, the SCU may request several DSP and memory groups to enable several iterative decoding processes to run parallel. During the call, the SCU uses the simple decoder, the BER estimator and the information extractor to dynamically adjust the allocated resources. For example if the signal quality improves, fewer iterations or iterative processes will be required to meet the BER target within the specified latency constraint.

Contrariwise, a degrading signal quality will require either more iterations or more iterative processes to provide a data signal meeting a BER target within a specified latency constraint. When the call is terminated the allocated resources are pooled, available for the next call received by the base station, or for an established call of lower priority already waiting for more resources to be freed.

Figure 5:
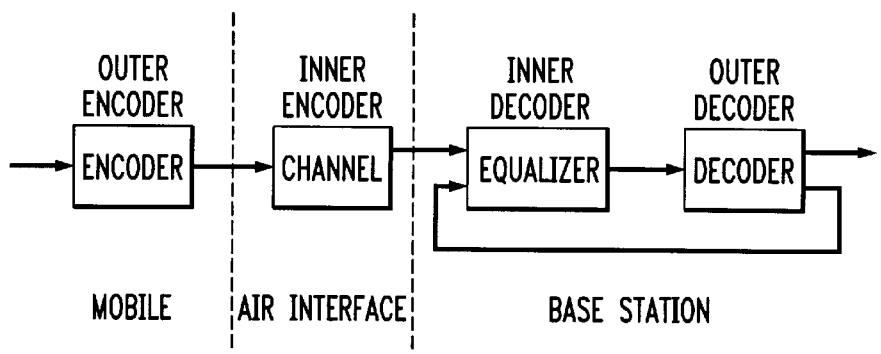
FIG. 5 represents the transmission of a signal over an air interface.
Figure 6:
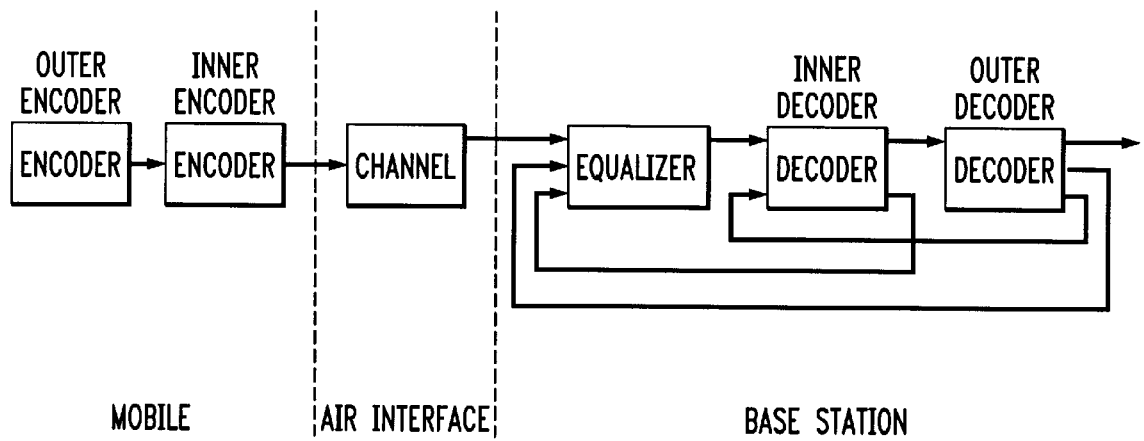
FIG. 6 is an alternative representation of the transmission of a signal over an air interface.

FIG. 5 represents the transmission of a digital signal from a mobile station to a base station over an air interface, with the communication channel acting as the inner encoder. FIG. 6 represents the transmission of a digital signal through a communication channel, also over an air interface, in which two encoders (inner and outer are used). Various iterative decoding paths are illustrated.

The foregoing is illustrative of the invention and other embodiments falling within the scope of the invention would be immediately apparent to one skilled in the art. For example, the function of the SCU may be performed by a central resource and the BER estimator and extractor functions may be performed within the central pool. The system may employ any one of a number of communications protocols without departing from the spirit of the invention.

What is claimed is:

1. Apparatus for iteratively decoding a signal comprising:

a signal processing unit; and iterative decoding resources for running at least one iterative decoding process on a signal wherein the iterative decoding resources are located in a central pool and are allocated to the signal processing unit when an iterative decoding process is required.

2. Apparatus as claimed in claim 1 wherein each signal processing unit includes a control unit which requests the iterative decoding resources from the central pool.

3. Apparatus as claimed in claim 2 wherein each signal processing unit may be allocated iterative decoding resources from the central pool upon a demand from the respective control unit.

4. Apparatus as claimed in claim 3 wherein the iterative decoding resources allocated to a signal processing unit may be altered during the decoding.

5. Apparatus as claimed in claim 1 wherein a plurality of signal processing units are provided, each with access to the central pool.

6. A method of iteratively decoding a signal comprising the steps of accepting a signal for decoding using iterative decoding resources to run at least one iterative decoding process on the signal wherein the iterative decoding resources are requested from a central pool and are allocated when an iterative decoding process is required.

7. A method as claimed in claim 6 wherein a plurality of signals may be accepted for decoding.

8. A method as claimed in claim 7 wherein the allocated iterative decoding resources may be altered as the signal is decoded.

9. A base station in a wireless communications system comprising:

at least one antenna;

circuitry connected to said at least one antenna for receiving a signal from said at least one antenna and producing a received signal;

at least one signal processing unit processes said received signal; and iterative decoding resources for running at least one iterative decoding process on a signal wherein said iterative decoding resources are located in a central pool and are allocated to said signal processing unit when an iterative decoding process is required.

10. The base station of claim 9 wherein a plurality of signal processing units are provided with access to the central pool.

11. The base station of claim 10 wherein each signal processing unit includes a control unit which requests said iterative decoding resources from said central pool.

12. The base station of claim 11 wherein each signal processing unit may be allocated iterative decoding resources from said central pool upon a demand from the respective control unit.

13. The base station of claim 12 wherein said iterative decoding resources allocated to a signal processing unit may be altered during the decoding.

14. A method for processing a signal in a wireless communications system comprising the steps of:

receiving a signal from at least one antenna to produce a received signal;

demodulating said received signal;

requesting iterative decoding resources from a central pool of said iterative decoding resources for said demodulated received signal; and using said iterative decoding resources allocated from said central pool to run at least one iterative decoding process on said demodulated received signal.

15. The method of claim 14 wherein said steps of receiving and demodulating comprise the steps of:

receiving a plurality of signals from at least one antenna to produces a plurality of received signals; and demodulating said plurality of received signals.

16. The method of claim 15 wherein said steps of requesting and using comprise the steps of:

requesting iterative decoding resources from said central pool for each of said plurality of demodulated received signals; and allocating iterative decoding resources from said central pool to run at least one iterative decoding process on each of said plurality of demodulated received signals.

* * * * *